US011251058B1

(12) United States Patent
Tomioka et al.

(10) Patent No.: US 11,251,058 B1
(45) Date of Patent: Feb. 15, 2022

(54) WORKPIECE-SEPARATING DEVICE AND WORKPIECE-SEPARATING METHOD

(71) Applicant: SHIN-ETSU ENGINEERING CO., LTD., Tokyo (JP)

(72) Inventors: Kyouhei Tomioka, Gunma (JP); Yoshikazu Ohtani, Gunma (JP)

(73) Assignee: SHIN-ETSU ENGINEERING CO., LTD., Tokyo (JP)

( * ) Notice: Subject to any disclaimer, the term of this patent is extended or adjusted under 35 U.S.C. 154(b) by 0 days.

(21) Appl. No.: 17/409,194

(22) Filed: Aug. 23, 2021

(30) Foreign Application Priority Data

Aug. 27, 2020 (JP) .............................. JP2020-143808

(51) Int. Cl.
*H01L 21/67* (2006.01)
*H01L 23/00* (2006.01)
*H01L 21/683* (2006.01)

(52) U.S. Cl.
CPC .... *H01L 21/67132* (2013.01); *H01L 21/6836* (2013.01); *H01L 21/6838* (2013.01); *H01L 24/98* (2013.01); *H01L 2221/68386* (2013.01); *H01L 2224/98* (2013.01)

(58) Field of Classification Search
CPC ........... H01L 21/67132; H01L 21/6836; H01L 21/6838; H01L 24/98; H01L 2221/68386; H01L 2224/98
See application file for complete search history.

(56) References Cited

U.S. PATENT DOCUMENTS

2013/0292062 A1* 11/2013 Iwashita ............. H01L 21/6838
156/750
2015/0020979 A1* 1/2015 Maeda .............. H01L 21/67103
156/711

FOREIGN PATENT DOCUMENTS

| JP | 06-244093   | 9/1994 |
| JP | 2001-267271 | 9/2001 |
| JP | 2004-179399 | 6/2004 |
| JP | 2004-251641 | 9/2004 |
| JP | 2008-159644 | 7/2008 |
| JP | 2012-182278 | 9/2012 |

(Continued)

OTHER PUBLICATIONS

Official Communication issued in Japan Patent Application No. 2020-143808, dated Jan. 12, 2021, along with an English translation thereof.

*Primary Examiner* — Dung A. Le
(74) *Attorney, Agent, or Firm* — Greenblum & Bernstein, P.L.C.

(57) ABSTRACT

A workpiece-separating device includes a holding member configured to detachably hold one of a workpiece or a supporting body of a laminated body and a light irradiation part configured to perform light irradiation on a separating layer, the holding member including: a stage facing one of the workpiece or the supporting body, a fixed supporting part projecting from the stage toward the laminated body and including a still suction pad immovable in a projection direction, and a movable supporting part projecting from the stage toward the laminated body and including a response suction pad that is movable in a projection direction and elastically deformable, a plurality of the fixed supporting parts and a plurality of the movable supporting parts disposed in a dispersed manner, and the plurality of response suction pads project toward the laminated body further than the plurality of still suction pads.

4 Claims, 9 Drawing Sheets

(56) References Cited

FOREIGN PATENT DOCUMENTS

JP      2017-228696     12/2017
WO      2020/080276     4/2020

* cited by examiner

WORKPIECE-SEPARATING DEVICE AND WORKPIECE-SEPARATING METHOD

TECHNICAL FIELD

The present disclosure relates to a workpiece-separating device used to peel a workpiece that is temporarily held on a supporting body from the supporting body in wafer level packaging (WLP), panel level packaging (PLP), or a process of manufacturing the workpiece to be formed as a product, such as processing of thin semiconductor wafers with relatively small thickness, and also relates to a workpiece-separating method using the workpiece-separating device.

BACKGROUND ART

There are well known examples of such workpiece-separating devices and workpiece-separating methods that include a laser lift-off device and laser lift-off method for decomposing a material layer and peeling the material layer from a substrate by: supporting a workpiece, deformed so as to protrude or recess upward, at three points via three supporting rods projecting from a stage, and irradiating the workpiece with laser beams from a laser source while the laser beams and the workpiece are moved relative to one another (see Patent Document 1, for example).

The three supporting rods are provided with cylindrical elastic members, and the workpiece is placed on the elastic members. In this manner, the elastic members elastically deform and hold the workpiece by adsorption.

In the workpiece of Patent Document 1, a substrate (sapphire substrate) that allows ultraviolet laser beams to pass through and the material layer are laminated together, with a support substrate adhering to the other side of the material layer. The amount of warping of a workpiece deformed so as to protrude downward may be approximately 400 μm in a case of a circular workpiece with a diameter of 4 inches.

In Patent Document 1, a laser source that generates pulse laser beams and a laser optical system used for shaping the laser beams into a predetermined shape are provided, and the pulse interval of the laser beams generated by the laser source is controlled to achieve a desired value for the degree of overlap of the laser beams with which adjacent irradiation regions are irradiated. In a case where the distance between the laser optical system (projection lens) and the workpiece varies (by approximately 400 μm), the laser beam intensity in the region irradiated with the pulse laser beams in an overlapping manner is set to be a value greater than a decomposition threshold required to decompose the material layer and peel the material layer from the substrate. In this manner, laser energy sufficient to allow the material layer to be peeled from the substrate is provided, which makes the material layer peelable from the substrate without causing cracking in the material layer formed above the substrate.

CITATION LIST

Patent Literature

Patent Document 1: Japanese Patent Application Laid-open No. 2012-182278

SUMMARY OF INVENTION

Technical Problem

However, the substrate and the workpiece (laminated body) are not limited to having the circular wafer shape described in Patent Document 1 and may have a rectangular (a quadrilateral shape with right angles, such as a rectangle or a square) panel shape. Moreover, the size (overall size) of the substrate and the laminated body is not limited to being 4 inches in diameter as described in Patent Document 1, and the substrate and laminated body may be a large type having a wafer shape with a diameter of 500 mm or greater or a panel shape with a side of 500 mm or greater. Examples of the thickness of the substrate and the laminated body also include that of wafer shapes and panel shapes thinned to 15 to 3,000 μm.

In this manner, a laminated body with a large overall size or with a thinned thickness has a smaller ratio (thickness/overall size) of the thickness to the overall (plane) size of the laminated body. Thus, the overall rigidity of the laminated body is decreased, and the laminated body may easily deform, deflecting under its own weight. This deflection deformation occurs regardless of the protruding or recessed deformation (warpage), and the amount of deflection deformation may be much larger than that of the warpage deformation of the laminated body.

In Patent Document 1, the workpiece (laminated body) with warpage deformation is supported at three points via the three supporting rods, and thus, in the case of a laminated body with relatively high overall rigidity, a stable three point support can be provided.

However, in the case of a laminated body with low overall rigidity, such as a laminated body with a large overall size or a thinned thickness, deflection deformation due to its own weight may occur at a location other than the three points where the laminated body is supported, resulting in the laminated body being unable to be stably held via only the three-point support. In the worst case, deflection deformation due to its own weight may cause the weight of the laminated body to be mainly applied to only one specific supporting rod of the three supporting rods. This may increase the amount of localized deflection deformation in the laminated body due to its own weight. In this manner, excessive force may be applied to one part of the laminated body and cause localized damage.

Furthermore, with the laminated body being supported in an unstable manner via only the three-point support, when the laser beams from the laser source and the laminated body move relative to one another during irradiation, misalignment of the laminated body on the stage may occur. Due to this misalignment of the laminated body, in the region irradiated with the pulse laser beams in an overlapping manner, some parts of the laminated body may not be irradiated with the pulse laser beams and excessive irradiation may be partially performed. The presence of the parts that are not irradiated may cause poor peeling, and the presence of the excessively irradiated parts may cause damage.

In addition, the cylindrical elastic members provided on the three supporting rods are elastically deformable, but the absolute position of each is fixed. For this reason, although each elastic member comes into contact with the warped laminated body, depending on the warped shape of the laminated body, the elastic deformation of each elastic member may not conform to the warped face of the laminated body, and gaps may occur between the two. Thus, the elastic members cannot stably hold the laminated body by adsorption.

In addition, when deflection deformation due to the laminated body's own weight occurs at a location other than the three points where the laminated body is supported, the laser irradiation distance from the laser optical system (projection lens) to the deflection deformation part may vary much more than in the case of warpage deformation. In this case, the variance in the laser irradiation distance causes the irradiation shape of the laser beams emitted to the deflection deformation part to be unstable, thereby increasing the likelihood that some parts are not irradiated with the laser beams and some parts are excessively irradiated with the laser beams.

Solution to Problem

According to an embodiment of the present invention, to solve the problems described above, provided is a workpiece-separating device that peels a supporting body from a workpiece including a circuit substrate by denaturing a separating layer via light irradiation of a laminated body, the laminated body including the workpiece and the supporting body laminated together with the separating layer interposed between the workpiece and the supporting body, the workpiece-separating device including: a holding member configured to hold one of the workpiece or the supporting body in a detachable manner; and a light irradiation part configured to perform the light irradiation on the separating layer through the other of the supporting body or the workpiece of the laminated body held by the holding member, in which the holding member includes a stage facing one of the workpiece or the supporting body of the laminated body, a fixed supporting part projecting from the stage toward the laminated body and including, on an end portion, a still suction pad immovable in a projection direction, and a movable supporting part projecting from the stage toward the laminated body and including, on an end portion, a response suction pad that is movable in a projection direction and elastically deformable, a plurality of the fixed supporting parts and a plurality of the movable supporting parts in combination are disposed in a dispersed manner, and the plurality of response suction pads are disposed so as to be able to project toward the laminated body further than the plurality of still suction pads.

According another embodiment of the present invention, to solve to problems described above, provided is a workpiece-separating method of peeling a supporting body from a workpiece including a circuit substrate by denaturing a separating layer via light irradiation of a laminated body, the laminated body including the workpiece and the supporting body laminated together with the separating layer interposed between the workpiece and the supporting body, the workpiece-separating method including: holding one of the workpiece or the supporting body with a holding member in a detachable manner; and performing the light irradiation from a light irradiation part on the separating layer through the other of the supporting body or the workpiece of the laminated body held by the holding member, wherein the holding member includes a stage facing one of the workpiece or the supporting body of the laminated body, a fixed supporting part projecting from the stage toward the laminated body and including, on an end portion, a still suction pad immovable in a projection direction, and a movable supporting part projecting from the stage toward the laminated body and including, on an end portion, a response suction pad that is movable in a projection direction and elastically deformable, a plurality of the fixed supporting parts and a plurality of the movable supporting parts in combination are disposed in a dispersed manner, the plurality of response suction pads are disposed so as to be able to project toward the laminated body further than the plurality of still suction pads, and in the holding one of the workpiece or the supporting body, as the laminated body experiences deflection deformation due to its own weight, the response suction pad moves in the projection direction and elastically presses against one of the workpiece or the supporting body.

DESCRIPTION OF EMBODIMENTS

Figure 1:
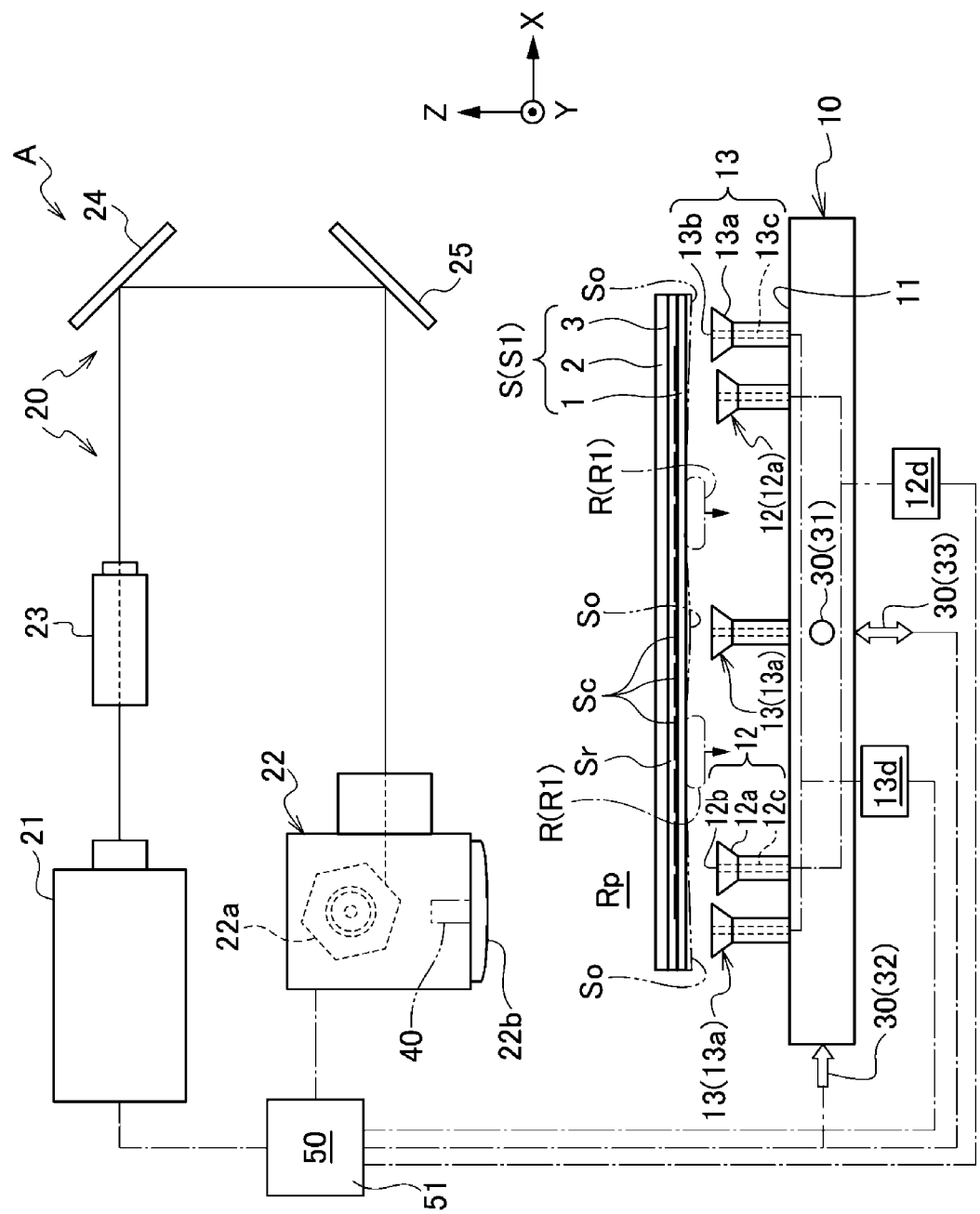
FIG. 1 is an explanatory diagram illustrating the overall configuration of a workpiece-separating device and a workpiece-separating method according to an embodiment (first example) of the present invention and is a front view of a vertical cross section of a state before holding (carrying-in process).

Embodiments of the present invention will be described below in detail with reference to the drawings.

As illustrated in FIGS. 1 to 9, a workpiece-separating device A and a workpiece-separating method according to embodiments of the present invention are a laser lift-off device and a laser lift-off method in which a separating layer 3 of a laminated body S, which includes a workpiece 1 including a circuit substrate (not illustrated) and a supporting body 2 laminated with the separating layer 3 disposed therebetween, is irradiated with light through the workpiece 1 and the supporting body 2, thereby denaturing (changing the properties of) the separating layer 3 via light absorption so as to make the separating layer 3 peelable, and the supporting body 2 is peeled from the workpiece 1. Such a workpiece-separating device and workpiece-separating method are used in semiconductor package manufacturing, such as wafer level packaging (WLP) and panel level packaging (PLP), semiconductor wafer processing, and the like.

Specifically, the workpiece-separating device A according to an embodiment of the present invention includes, as main components, a holding member 10 configured to hold the laminated body S in a detachable manner, and a light irradiation part 22 of an optical system 20 configured to irradiate the separating layer 3 of the laminated body S with light beams L for peeling.

Preferably, the workpiece-separating device A further includes a driving part 30 configured to move a light irradiation position P of light from the light irradiation part 22 relative to the supporting body 2 and the separating layer 3, a length measuring part 40 configured to measure distance from the light irradiation part 22 to the irradiated face of the supporting body 2 and the separating layer 3, and a controlling part 50 configured to perform operation control of the light irradiation part 22, the driving part 30, the length measuring part 40, and other components.

Note that, as illustrated in FIGS. 1 to 9, the laminated body S is normally placed in the vertical direction with respect to the holding member 10, and the light beams L for peeling are emitted downward from the light irradiation part 22 toward the laminated body S on the holding member 10. The holding direction of the laminated body S with respect to the holding member 10 and the irradiation direction of the light beams L for peeling are referred to as the Z-direction below. The two directions intersecting the irradiation direction (Z-direction) of the light beams L for peeling are referred to as the XY-directions below.

The workpiece 1 is formed from a portable substrate including a circuit substrate subjected to semiconductor processing, such as circuit formation treatment or thinning treatment, in a laminated state in which the workpiece 1 is bonded to the supporting body 2 described later. The workpiece 1 is formed from a material such a silicon and has a thin plate shape.

The overall shape of the workpiece 1 may include a rectangular (a quadrilateral shape with right angles, such as a rectangle or a square) panel shape, a circular wafer shape, and the like.

The thickness of the workpiece 1 also includes that of a rectangular or circular substrate that is thinned to 15 to 3000 μm, for example. In particular, in a case where the workpiece 1 has a panel shape or a wafer shape with a very thin (referred to below as "ultra-thin") thickness of approximately several tens of μm, the entire face of the workpiece 1 may be supported, being bonded to a tape-like adhesive sheet for holding, such as a dicing tape, or the workpiece 1 may be supported, being bonded to a tape-like adhesive sheet for holding with its outer peripheral portion reinforced by a quadrangular or circular (ring-like) holding frame, such as a dicing frame.

The supporting body 2 is a support substrate or a carrier substrate that supports the workpiece 1 in the thinning, various processing, and carrying of the workpiece 1 and provides the necessary strength to prevent damage and deformation of the workpiece 1. For this reason, the supporting body 2 is formed of a hard, rigid material in the shape of a rectangle or circle with a size corresponding to the workpiece 1.

Either or both of the workpiece 1 or the supporting body 2 are formed of a transparent or semitransparent rigid material that allows laser beams L of a specific wavelength to pass through. In the case of the supporting body 2 being the specific example illustrated in the drawings, a transparent or semitransparent glass plate, ceramic plate, or acrylic resin plate that allows the laser beams L of a specific wavelength to pass through may be used, for example, with the thickness thereof being set to from 300 to 3000 μm.

The separating layer 3 is irradiated with the laser beams L through the workpiece 1 or the supporting body 2 and absorbs the laser beams L, so that the separating layer 3 changes properties, having its adhesive strength reduced. This changes properties in the layer such that a small external force causes the separating layer 3 to lose adhesiveness and peel off or be destroyed.

The separating layer 3 is preferably made of a material such as a polyimide resin that has adhesiveness and allows both the workpiece 1 and the supporting body 2 to be bonded without needing an adhesive layer made from an adhesive. Furthermore, another layer that can be easily cleaned and removed after peeling of the workpiece 1 and the supporting body 2 can be laminated. In addition, in a case where the separating layer 3 is formed from a material that does not have adhesiveness, an adhesive layer (not illustrated) made from an adhesive needs to be disposed between the separating layer 3 and the workpiece 1 to bond the separating layer 3 and the workpiece 1 together using the adhesive layer.

The laminated body S used is mainly a body with a thinned thickness in the Z-direction and a large overall size in the XY-directions such as a body with one side of 500 mm or greater in a case of a rectangular shape, and a body with a diameter of 200 mm or 300 mm or greater in a case of a circular shape.

In a case of the laminated body S being the specific example illustrated in FIGS. 1 to 5, the laminated body S has a panel shape (square shape) including a rectangular (square) substrate serving as the workpiece 1 and a rectangular (square) support substrate (carrier substrate) serving as the supporting body 2, the two being bonded together with the separating layer 3. The panel-shaped laminated body S has a four layer structure including the workpiece 1 manufactured via fan-out PLP technology or the like, a sealing body including a plurality of semiconductor elements Sc installed on the face of the workpiece 1 and sealed with a sealing material Sr such as a resin, the separating layer 3 laminated on the face of the sealing body, and the supporting body 2 laminated with the separating layer 3 sandwiched therebetween. After the sealing body provided with the plurality of semiconductor elements Sc is ultimately cut in the XY-directions via dicing or the like, a final process such as attaching an electrode extraction part via rewiring layer is performed. In this manner, the final product, i.e., a plurality of electronic components, is manufactured.

In the example illustrated in the drawings, the laminated body S is disposed with the supporting body 2 facing the light irradiation part 22 described below. Accordingly, the separating layer 3 is irradiated with the light beams L for peeling through the supporting body 2.

Though not illustrated, in another example, the laminated body S may have a wafer shape including a circular wafer serving as the workpiece 1 and a circular support substrate (carrier substrate) serving as the supporting body 2 bonded together with the separating layer 3. Furthermore, in other examples, the laminated body S may be changed to a three layer structure including the workpiece 1, the separating layer 3, and the supporting body 2, or the laminated body S may be disposed with the workpiece 1 facing the light irradiation part 22 described below and the separating layer 3 may be irradiated with the light beams L for peeling through the workpiece 1.

The holding member 10 is a holding mechanism used for supporting the laminated body S in an immovable manner at a predetermined position of the holding member 10 before the laminated body S is carried by a carrying-in mechanism R from a supply source (not illustrated) and separated. According to this holding mechanism, either the workpiece 1 or the supporting body 2 of the laminated body S is held in a detachable manner. With the laminated body S held in this manner, the separating layer 3 is irradiated with the light beams L for peeling from the light irradiation part 22 through the other of the supporting body 2 or the workpiece 1 of the laminated body S without misalignment.

The holding member 10 includes a stage 11 configured to support, in an immovable manner, the laminated body S that is carried in, and a fixed supporting part 12 and a movable supporting part 13 that project from the stage 11 toward the laminated body S.

The stage 11 is formed into a smooth shape with dimensions greater than the dimensions of the external shape of the laminated body S on a surface plate or the like. The surface plate is made of a rigid member such as metal and has a thickness large enough not to be distorted (deflected).

On the stage 11, a plurality of the fixed supporting parts 12 and the movable supporting parts 13 are disposed together in a dispersed arrangement facing either the workpiece 1 or the supporting body 2 of the laminated body S in the Z-direction.

As the carrying-in mechanism R, a carrying robot or the like that is movable between the supply source (not illustrated) of the laminated body S and the holding member 10 is preferably used to bring the laminated body S close to the stage 11. The carrying robot serving as the carrying-in mechanism R includes a plurality of robot hands R1 and is controlled so that the plurality of robot hands R1 hold and support, from underneath, the laminated body S before separation, which is taken from the supply source (not illustrated) of the laminated body S, at a plurality of portions on the lower face and carry the laminated body S to the stage 11 of the holding member 10. The plurality of robot hands R1 are controlled so as to carry the laminated body S to a space position Rp facing the stage 11 in the Z-direction in a state before the laminated body S is held as illustrated in FIG. 1 and other figures, and then lower the laminated body S toward the fixed supporting parts 12 and the movable supporting parts 13. Furthermore, the plurality of robot hands R1 are controlled so as to release support of the laminated body S and return toward the supply source of the laminated body S in a state after the laminated body S is passed to and held by the fixed supporting parts 12 and the movable supporting parts 13 illustrated in FIG. 3 and other figures.

The fixed supporting part 12 is made of a hard material and formed into a non-extensible tube shape. The fixed supporting part 12 is disposed in an upright manner on the stage 11 and is unmovable in the XY-directions and the Z-direction. A still suction pad 12a that is unmovable in the Z-direction is provided on the end portion of the fixed supporting part 12 facing either the workpiece 1 or the supporting body 2 of the laminated body S (workpiece 1 in the illustrated example).

The still suction pad 12a is made of an elastically deformable material and formed in a cylindrical shape, for example. The still suction pad 12a is disposed a predetermined length away from the stage 11 in the Z-direction and includes a first air intake hole 12b therein. The first air intake hole 12b communicates with a first intake and exhaust source 12d, such as a vacuum pump or a compressor, via a first ventilation passage 12c formed inside the fixed supporting part 12. The still suction pad 12a is configured to elasticity deform along and adsorb the laminated body S (workpiece 1 in the illustrated example) by a suction action of the first intake and exhaust source 12d.

The movable supporting part 13 includes a tube-like body made of a hard material with an elastic body such as a spring installed therein. With this configuration, the movable supporting part 13 is disposed in an upright manner, is immovable in the XY-directions and elastically extensible in the Z-direction. A response suction pad 13a that is elastically movable (stretchable) in the Z-direction is provided on the end portion of the movable supporting part 13 facing either the workpiece 1 or the supporting body 2 of the laminated body S.

The response suction pad 13a is preferably made of an elastically deformable material and formed into a cylindrical shape. The response suction pad 13a is also preferably disposed at a position close to the still suction pad 12a in the XY-directions. The response suction pad 13a includes a second air intake hole 13b therein, and the second air intake hole 13b communicates with a second intake and exhaust source 13d via a second ventilation passage 13c formed inside the movable supporting part 13. The response suction pad 13a is configured to elasticity deform along and adsorb one of the workpiece 1 or the supporting body 2 of the laminated body S by a suction action of the second intake and exhaust source 13d.

In addition, in at least an initial state before the laminated body S is held by the holding member 10, the response suction pad 13a is preferably disposed so as to project toward the laminated body S (workpiece 1 in the illustrated example) further than the still suction pad 12a. The amount of elastic movement of the response suction pad 13a is set such that the response suction pad 13a can project and be recessed in the Z-direction by a predetermined length relative to the height position of the still suction pad 12a.

Furthermore, an adsorption trace prevention member configured to reduce damage to the workpiece 1 or the supporting body 2 is preferably attached to the still suction pad 12a and the response suction pad 13a at the adsorption position relative to either the workpiece 1 or the supporting body 2 of the laminated body S.

An appropriate number of the fixed supporting parts 12 (still suction pads 12a) and the movable supporting parts 13 (response suction pads 13a) are appropriately distributed on the stage 11 so as to cope with the difference in the overall size, the thickness, the rigidity, and the weight of the laminated body S. For example, three or more sets of the fixed supporting parts 12 and the movable supporting parts 13 may be disposed at substantially equal intervals on an imaginary circle centered on a reference point 11a of the stage 11 facing the center of gravity position of the laminated body S in the Z-direction. The fixed supporting part 12 and the movable supporting part 13 of each set are disposed close to each other.

The placement positions of the movable supporting parts 13 (response suction pads 13a) are preferably set at positions close to and outward from the placement positions of the fixed supporting parts 12 (still suction pads 12a), centered on the reference point 11a of the stage 11.

The height position of the still suction pads 12a is separated from the stage 11 by a predetermined length (approximately 30 mm or greater) in the Z-direction. This allows for entry of the plurality of robot hands R1 serving as the carrying-in mechanism R and prevents the stage 11 from being inadvertently processed by the light beams (laser beams) L for peeling emitted from the light irradiation part 22 described below.

In the dispersion arrangement of the still suction pads 12a and the response suction pads 13a illustrated in FIGS. 1 to 5, four response suction pads 13a are disposed in a radial pattern centered on the reference point 11a of the stage 11 in a manner corresponding to the panel-shaped (square) laminated body S, and four still suction pads 12a are disposed close to and inward from the response suction pads 13a. In addition, a total of five fixed supporting parts 12 may be disposed at the reference point 11a of the stage 11 or in a cross pattern centered on the reference point 11a.

In a state before the laminated body S is held as illustrated in FIG. 1 and other figures, the response suction pads 13a of the movable supporting parts 13 project toward the laminated body S a maximum of approximately 5 mm or greater from the height position of the still suction pads 12a. In a state after the laminated body S is held as illustrated FIG. 3 and other figures, the response suction pads 13a of the movable supporting parts 13 are recessed a maximum of approximately 5 mm or greater from the height position of the still suction pads 12a.

Though not illustrated, in other examples, the dispersion arrangement and quantity of the still suction pads 12a and the response suction pads 13a may be changed to a dispersion arrangement and quantity other than those in the illustrated example. In addition, the projection amount and the recess amount of the response suction pads 13a relative to the height position of the still suction pads 12a can be changed depending on the overall size and thickness of the laminated body S.

The light irradiation part 22 is a part of the optical system 20 that guides the light beams L for peeling from a light source 21 such as a laser oscillator toward the target light irradiation position P. The light irradiation part 22 is disposed facing the laminated body S held by the holding member 10 in the Z-direction. The light irradiation part 22 has a scanning (sweeping) function configured to move the light beams L such as laser beams guided by the optical system 20 along the laminated body S. Accordingly, the laser beams L guided by the optical system 20 pass through the supporting body 2 of the laminated body S, and the entire face of the separating layer 3 is irradiated with the laser beams L.

Examples of the light beam L for peeling emitted from the light irradiation part 22 with which the laminated body S is irradiated include a laser beam and an infrared light. Of these examples, the light beam L for peeling is preferably a laser beam with a wavelength that is able to pass through the workpiece 1 or the supporting body 2 and be absorbed by the separating layer 3.

Specifically, of these laser beams, in terms of the projected shape, a spot like (dot like) laser beam that easily produces a high output laser is preferable to a line like (slit like) laser beam. A pulse-oscillated laser beam (pulse laser beam) is preferable to a continuously-oscillated laser beam (continuous wave laser) due to its ability to reduce the effects of heat from the laser energy absorbed inside the separating layer 3 and provide high energy inside the separating layer 3.

In other words, the light irradiation part 22 is preferably provided with a light sweeping unit (laser scanner) 22a for moving an optical axis (main axis) L1 of spot like laser beams, for example, generated at the light source 21 as the light beams L for peeling and is preferably configured to scan (sweep) the laminated body S by using laser beams via the laser scanner 22a.

As illustrated in FIGS. 1 to 9, the light irradiation part 22 preferably includes the laser scanner 22a that moves, along the laminated body S, the optical axis L1 of the spot like laser beams L generated at the light source 21, and a lens 22b that guides the laser beams L from the laser scanner 22a toward the separating layer 3.

As the laser scanner 22a, a polygon scanner or a Galvano scanner provided in a rotatable manner is preferably used. The laser scanner 22a preferably performs sweeping in either or both of the XY-directions intersecting the light irradiation direction from the laser scanner 22a toward the separating layer 3 (Z-direction).

The lens 22b has a function of focusing the laser beams L emitted from the laser scanner 22a. Preferably, an fθ lens used in combination with a polygon scanner or a Galvano scanner is used. The fθ lens allows the scan speed to be constant at the center of the lens and at the periphery thereof and allows the beams to be focused on one plane.

Furthermore, the lens 22b is preferably a telecentric lens that is capable of providing a main light beam L2 in parallel with the optical axis L1 that passes through the lens center and is perpendicular with the lens plane, or a non-telecentric lens which is capable of providing a main light beam L2 at various angles with respect to the optical axis L1.

In particular, in the case of a non-telecentric lens, the lens center part (the lens center and the vicinity thereof) is preferably mainly used to provide irradiation of the laser beams L in a stable manner, and the lens outer circumferential end part is preferably not used as it provides irradiation of the laser beams L in an unstable manner.

In the specific examples of the optical system 20 and the light irradiation part 22 illustrated in FIGS. 1 to 9, first the laser beam L generated at the laser oscillator serving as the laser light source 21 is passed through a beam expander 23, so that the beam diameter is adjusted. Following this, the orientation of the laser beam L is changed at reflective mirrors 24 and 25, which are steering mirrors, for example, and the laser beam L is guided to the laser scanner 22a. Finally, sweeping is performed by sequentially irradiating the target position of the laminated body S held by the holding member 10 with ultrashort pulses of the laser beam L from the laser scanner 22a passing through the lens 22b.

In the example of the laser scanner 22a and the lens 22b illustrated in FIGS. 1 to 5, a polygon scanner is used as the laser scanner 22a, and the polygon scanner includes a mirror part disposed in the shape of a regular n-sided polygon around its rotationally driven cylindrical body. As the lens 22b, a non-telecentric lens (non-telecentric fθ lens) is used.

The laser beam L incident on the polygon scanner is reflected at the mirror part and passes through the lens 22b, so that the laser beam L is converted to a laser beam on an optical path substantially perpendicular to or at a predetermined angle to the laminated body S. The sweep direction caused by the rotational drive of the mirror part of the polygon scanner is only one of the XY-directions. In the illustrated example, the laser beams L are moved in only one direction by a predetermined width in a linear direction parallel with the laser incident direction (X-direction) with respect to the mirror part of the regular n-sided polygon.

Moreover, in examples that are not illustrated, a Galvano scanner or a combination of a polygon scanner and a Galvano scanner may be used as the laser scanner 22a, or other structures may be used, and sweeping may be performed in one or both of the XY-directions or the laser beams L may reciprocate in both directions. Furthermore, a telecentric lens (telecentric fθ lens) may be used as the lens 22b.

There is a limit to the range over which the laminated body S can be irradiated with the laser beams L from the light irradiation part 22 (laser scanner 22a). With the laminated body S having a relatively large area, it is difficult to irradiate all of the entire separating layer 3 with the laser beams L from the laser scanner 22a at once.

Furthermore, in order to reliably peel the supporting body 2 from the workpiece 1, the separating layer 3 must be decomposed evenly across the entire face and have its properties changed so that it is peelable with the amount of energy (energy density) of the laser beams L from the laser scanner 22a with which the separating layer 3 is irradiated. The amount of energy required for the decomposition and change of properties differs depending on the material of the separating layer 3.

As described in JP 2012-024783 A, under such circumstances, some have thought to divide the entire separating layer 3 into a plurality of regions and irradiate each divided region with the laser beams L from the laser scanner 22a one time (one shot).

However, even if the entire separating layer 3 is divided into a plurality of irradiation regions, the size of each irradiation region may be so large that the laser beams L may be unable to be sufficiently focused on each irradiation region, meaning the amount of energy (energy density) of the laser beams L with which each irradiation region is irradiated may not reach the levels needed to decompose the entire face of the separating layer 3 evenly. Depending on the material of the separating layer 3, the change of properties has been unsuccessful in reaching the levels needed to evenly decompose the entire face of the irradiation regions and make the irradiation regions peelable, causing peeling irregularities.

In order to solve this problem, preferably, the entire laminated body S (separating layer 3) is divided into a plurality of irradiation regions and aligned irradiation of spot like laser beams L from the laser scanner 22a is performed on the plurality of irradiation regions.

Figure 2:
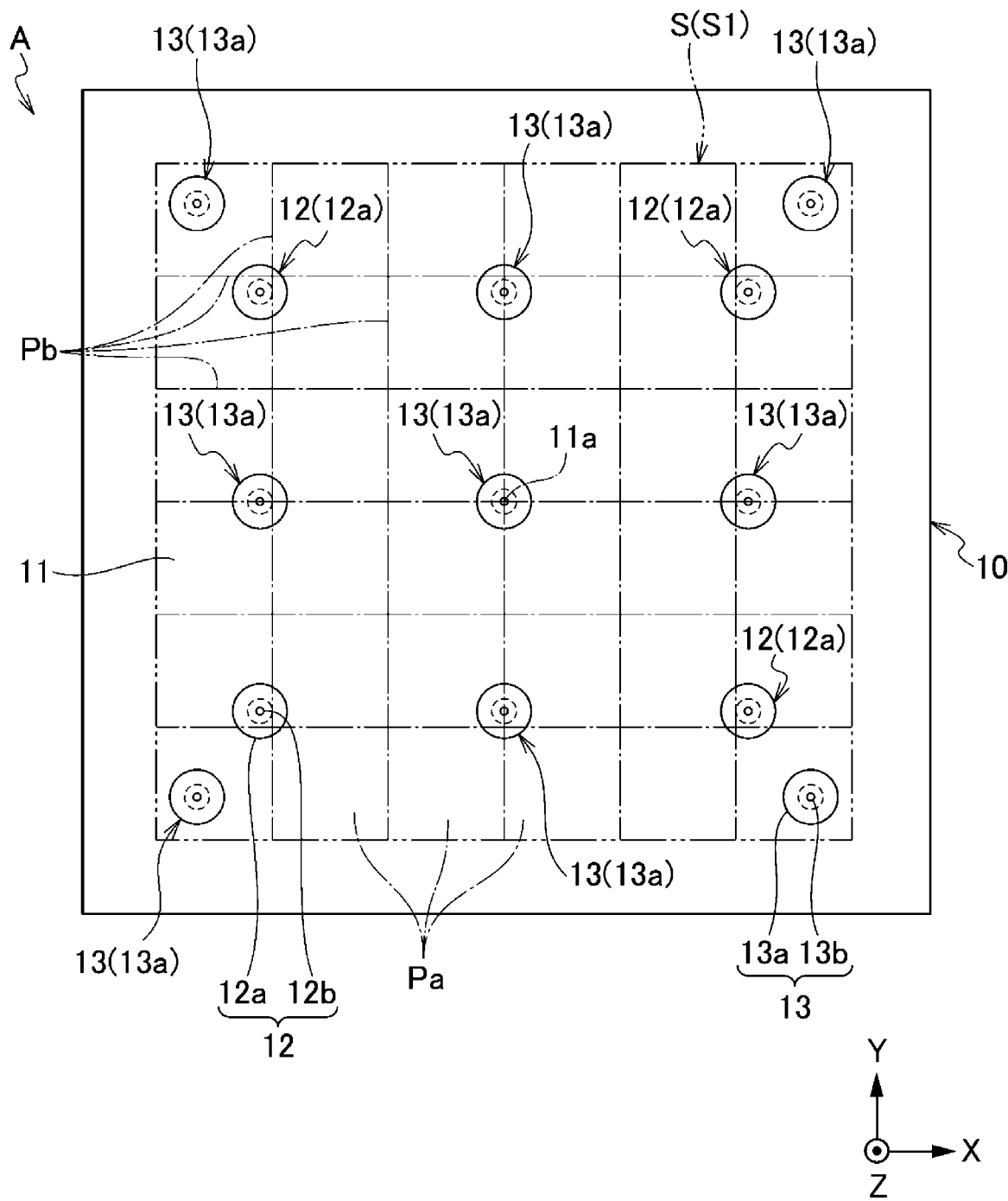
FIG. 2 is a plan view of a horizontal cross section of the same.

In other words, in the region of the laser beams L emitted from the laser scanner 22a toward the laminated body S (separating layer 3) held by the holding member 10, the entire irradiated face of the separating layer 3 is divided into a plurality of irradiation regions Pa, as illustrated in FIG. 2, and aligned irradiation is performed using the spot like laser beams L from the laser scanner 22a on each of the irradiation regions Pa (one irradiation region at a time).

Specifically, the separating layer 3 is preferably divided such that the plurality of irradiation regions Pa has a smaller area than the entire area of the laminated body S (separating layer 3), and the shape of each of the divided irradiation regions Pa is preferably a rectangle (a quadrilateral shape with right angles, such as a rectangle or a square) or a band-like shape with one side in one of the XY-directions being longer. The dividing direction (arrangement direction) of the plurality of irradiation regions Pa is the movement direction of the laser beams L (optical axis L1) by the laser scanner 22a or is an arrangement direction in the X-direction or the Y-direction the same as the relative movement direction by the driving part 30 described below. The size of the plurality of irradiation regions Pa is preferably able to be adjusted by the controlling part 50 described below. The order of laser irradiation of the plurality of irradiation regions Pa with the laser beams L from the laser scanner 22a is preferably able to be adjusted by the controlling part 50 described below, and the entire face of each of the irradiation regions Pa is preferably irradiated with the laser beams L from the laser scanner 22a in a discretionary order.

As to the spot like laser beams L from the laser scanner 22a with which the plurality of irradiation regions Pa of the laminated body S (separating layer 3) are irradiated, each laser beam L has a circular, substantially circular, or rectangular beam shape (cross-sectional shape), for example. In particular, the shape is preferably set to the same circular shape as the cross-sectional shape of a Gaussian beam.

Preferably, the irradiation of the laser beams L at each of the irradiation regions Pa is sequentially performed by aligned irradiation in which the laser beams L are aligned in the X-direction and the Y-direction via at least the operation of the laser scanner 22a or in combination with the operation of the driving part 30 described below, such that a portion of each of the laser beams L overlap.

In this case, the entirety of a single irradiation region Pa of the plurality of irradiation regions Pa is filled with a large number of spot like laser beams L without gaps. After the entirety of the single irradiation region Pa is filled with the large number of spot like laser beams L, aligned irradiation of the next irradiation region Pa with the spot like laser beams L is similarly repeated. Ultimately, aligned irradiation is performed on all of the plurality of irradiation regions Pa.

In addition, the interval between the spot like laser beams L generated by aligned irradiation on either side of a boundary Pb of the plurality of irradiation regions Pa is preferably set to be less than the beam diameter of the laser beams L. Moreover, aligned irradiation is preferably performed such that the end portion of each of the spot like laser beams L comes into contact with the end portion of the spot like laser beam L disposed on the opposite side of the boundary Pb.

The boundaries Pb of the plurality of irradiation regions Pa are boundary lines formed between the irradiation regions Pa arranged adjacent to one another in the X-direction and the Y-direction. The interval of the boundaries Pb refers to the distance between the beam centers of the spot like laser beams L generated by aligned irradiation on either side of each boundary Pb. Accordingly, the entirety of each of the irradiation regions Pa is filled with a plurality of spot like laser beams L, and the boundaries Pb of the irradiation regions Pa are also filled with the plurality of spot like laser beams L.

The driving part 30 is an optical-axis relative moving mechanism that is configured to move one or both of the holding member 10 and the light irradiation part 22 (laser scanner 22a) to relatively move the laser beams L emitted from the laser scanner 22a with respect to the laminated body S held by the holding member 10 in at least two directions (XY-directions) that intersect the irradiation direction (Z-direction) of the laser beams L from the laser scanner 22a.

The relative movement direction of the driving part 30 is not limited to the XY-directions and may include the Z-direction as necessary.

The optical-axis relative moving mechanism serving as the driving part 30 may be a workpiece-side moving type that moves mainly the holding member 10 and the laminated body S or an optical axis-side moving type that moves the laser scanner 22a.

In the specific example illustrated in FIGS. 1 to 9, the driving part 30 is a workpiece-side moving type, and the holding member 10 is provided with the driving part 30 to move the holding member 10 in the X-direction, the Y-direction, and the Z-direction via the driving part 30. This moves the light irradiation position P from the laser scanner 22a in the XY-directions and the Z-direction. In this case, an XY stage or an XY table is used as the driving part 30, and the driving part 30 includes a Y-axis moving mechanism 31 and an X-axis moving mechanism 32, both including a motor shaft. Furthermore, as necessary, a Z-axis moving mechanism 33 that moves the holding member 10 in the Z-direction is preferably provided.

In addition, in the case where the driving part 30 is an optical axis-side moving type, though not illustrated, the driving part 30 is provided on only a part of the optical system 20 and is configured to move the light irradiation position P of light from the laser scanner 22a in the XY-directions and the Z-direction without moving the holding member 10. In this case, the driving part 30 includes an XY-axis moving mechanism including a polygon scanner or a Galvano scanner. Furthermore, in a case where, as necessary, relative movement in the Z-direction is performed, the holding member 10 is provided with the Z-axis moving mechanism 33, or the laser scanner 22a is moved in the Z-direction by the driving part 30.

The length measuring part 40 includes a non-contact displacement meter or displacement sensor for measuring the irradiation distance from the light irradiation part 22 to the supporting body 2 of the laminated body S held by the holding member 10 or the irradiated face of the separating layer 3 and is disposed facing the laminated body S held by the holding member 10 in the Z-direction.

In the specific example illustrated in FIGS. 1 to 9, the length measuring part 40 is a laser displacement meter provided in the light irradiation part 22 (laser scanner 22a), and measures the length from the laser scanner 22a to the irradiated face of the separating layer 3 in the Z-direction and outputs the measurement value to the controlling part 50 described below.

In this manner, as illustrated in FIGS. 4 to 9, in a case where the laminated body S has warpage deformation, when aligned irradiation is performed on each of the plurality of irradiation regions Pa with the spot like laser beams L from the laser scanner 22a, operation control can be executed on the Z-axis moving mechanism 33 by using the measurement value obtained by the length measuring part 40 to make the irradiation distance from the laser scanner 22a to the plurality of irradiation regions Pa substantially constant. Accordingly, the irradiation distance between the laser scanner 22a and the separating layer 3 of the laminated body S that has warpage and is held by the holding member 10 can be adjusted to be substantially constant.

Though not illustrated, in another example, a displacement meter or a displacement sensor other than a laser displacement meter may be used as the length measuring part 40.

The controlling part 50 is a controller that is electrically connected to the first intake and exhaust source 12d of the fixed supporting part 12 and the second intake and exhaust source 13d of the movable supporting part 13 of the holding member 10, the light source 21 and the light irradiation part 22 (laser scanner 22a) of the optical system 20, the optical axis relative moving mechanism constituted by the driving part 30, and the length measuring part 40.

Furthermore, the controlling part 50 is a controller that is electrically connected to the carrying-in mechanism R configured to carry the laminated body S before separation toward the holding member 10, a peeling mechanism (not illustrated) that holds and peels only the supporting body 2 from the laminated body S after light irradiation, a carrying-out mechanism (not illustrated) configured to carry the laminated body S (workpiece 1) after peeling from the holding member 10, and the like.

The controller serving as the controlling part 50 executes operation control sequentially at preset timings in accordance with a program preset in a control circuit (not illustrated) provided in the controller. In other words, the controlling part 50 executes operation control of the entire workpiece-separating device A including ON/OFF control of the light beams (laser beams) L for peeling from the light source 21 with which the light irradiation position P is irradiated, as well as various settings, such as setting various parameters for the laser beams L.

The controlling part 50 controls the light irradiation part 22 (laser scanner 22a) of the optical system 20 and the driving part 30 to perform irradiation of the laser beams L from the laser scanner 22a at each of the plurality of irradiation regions Pa divided from the separating layer 3 of the laminated body S held by the holding member 10 and to set the irradiation angle of the laser beams L to be substantially perpendicular or at a predetermined angle to the face of the separating layer 3.

In addition, the controller serving as the controlling part 50 includes an input unit 51 such as a touch panel, a display unit (not illustrated), and is configured to set the scanning distance of the laser scanner 22a, the size of each of the irradiation regions Pa, the irradiation order of the laser beams L from the laser scanner 22a to the irradiation regions Pa, and the like via operation of the input unit 51.

A program provided in the control circuit of the controlling part 50 will now be described as an example of a workpiece-separating method executed by the workpiece-separating device A.

A workpiece-separating method using the workpiece-separating device A according to the embodiment of the present invention mainly includes: a holding process of holding one of the workpiece 1 or the supporting body 2 of the laminated body S with the holding member 10 in a detachable manner and a light irradiation process of irradiating the separating layer 3 with the light beam (laser beam) L for peeling from the light irradiation part 22 through the other one of the supporting body 2 or the workpiece 1 of the laminated body S held by the holding member 10.

Further, processes before the holding process include a carrying-in process of carrying the laminated body S before separation from the supply source (not illustrated) of the laminated body S via the carrying-in mechanism R.

Processes after the light irradiation process include a relative moving process of relatively moving the light irradiation position P from the light irradiation part 22 with respect to the separating layer 3 of the laminated body S held by the holding member 10 and a separating process of peeling the supporting body 2 from the workpiece 1 of the laminated body S.

Further, processes after the separation process preferably include a cleaning process of cleaning residue of the separating layer 3 that remains on the workpiece 1 after separation from the separating layer 3 and a cutting process of cutting the workpiece 1 after the cleaning process via dicing or the like.

In the carrying-in process, the laminated body S before separation is carried in toward the stage 11 of the holding member 10 via operation of the plurality of robot hands R1 serving as the carrying-in mechanism R, and the plurality of robot hands R1 move close toward the fixed supporting parts 12 and the movable supporting parts 13 that project out and stand by at predetermined positions of the stage 11.

In the holding process, the plurality of robot hands R1 move close to the stage 11, either the workpiece 1 or the supporting body 2 of the laminated body S is sequentially brought into contact with the movable supporting parts 13 and the fixed supporting parts 12, and the entire laminated body S is held in an immovable manner by adsorption by the response suction pads 13a of the movable supporting parts 13 and the still suction pads 12a of the fixed supporting parts 12.

Here, the laminated body S carried in to the stage 11 of the holding member 10 experiences deflection deformation due to its own weight differently and is held in a different way by the fixed supporting parts 12 and movable supporting parts 13 depending on the difference in size (overall size) and thickness.

In other words, in a case where the overall size of the laminated body S in the XY-directions is increased or the thickness in the Z-direction is thinned, the ratio (thickness/overall size) of the thickness to the overall size is reduced. Thus, the overall rigidity of the laminated body S is reduced. When the laminated body S with a low overall rigidity is held by only the plurality of fixed supporting parts 12, the laminated body S experiences deflection deformation due to its own weight at sections other than the sections where the laminated body S is supported by the fixed supporting parts 12. This deflection deformation occurs regardless of warpage, and the amount of deflection deformation may be much larger than that of the warpage deformation of the laminated body S.

Thus, in order to solve such problems, the movable supporting parts 13 are provided at predetermined positions of the holding member 10 in addition to the fixed supporting parts 12 as the holding mechanism for supporting the laminated body S in an immovable manner, and the fixed supporting parts 12, and the movable supporting parts 13 in combination are arranged in a dispersed manner. Furthermore, in the initial state before the laminated body S is held by the holding member 10, the response suction pads 13a of the movable supporting parts 13 are disposed projecting toward either the workpiece 1 or the supporting body 2 of the laminated body S further than the still suction pads 12a of the fixed supporting part 12.

Next, a representative example will be described in which the laminated body S carried in on the stage 11 is held in a different way by the fixed supporting parts 12 and the movable supporting parts 13 depending on the deflection deformation or warpage deformation due to the weight of the laminated body S.

Figure 3:
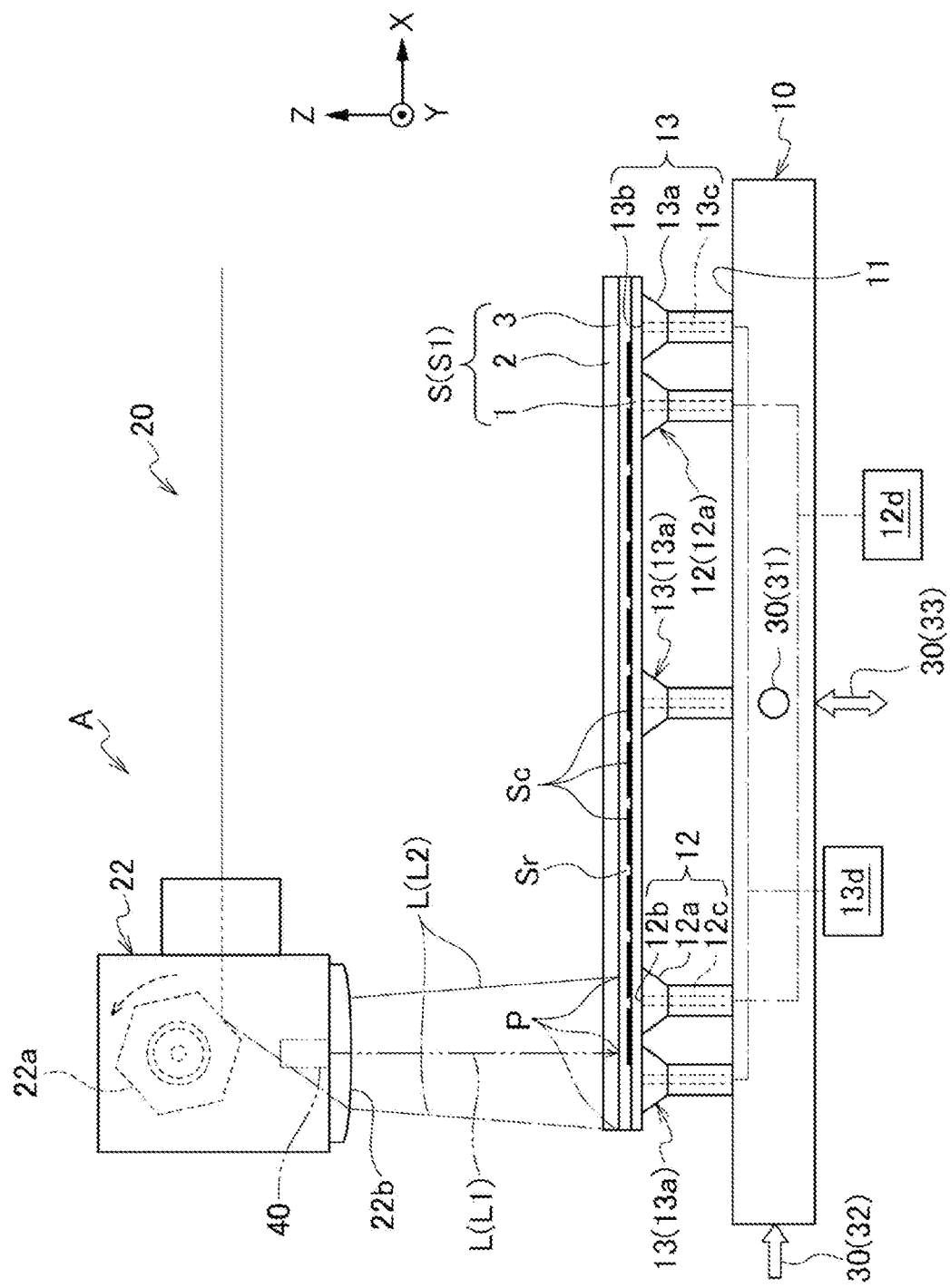
FIG. 3 is a partially enlarged front view of a vertical cross section of a state after holding (holding process) of the same.

The first example illustrated in FIGS. 1 to 3 represents a case of a first laminated body S1 with no warpage deformation.

In the state before the first laminated body S1 is held illustrated in FIG. 1, even when the first laminated body S1 has no warpage deformation, the lower face of the first laminated body S1 is supported and held from underneath at a plurality of portions by the plurality of robot hands R1 serving as the carrying-in mechanism R, thereby an unsupported portion So that is not a supported portion tends to experience localized deflection deformation downward due to its own weight.

In the illustrated example, even with two robot hands R1 supporting the first laminated body S1 at a plurality of portions, as illustrated by the two-dot chain line in FIG. 1, unsupported portions So of the first laminated body S1 such as the central portion and the peripheral portion experience localized deflection deformation due to its own weight and sag downward.

In this case, as the first laminated body S1 is lowered from the space position Rp by the plurality of robot hands R1 serving as the carrying-in mechanism R, the unsupported portions So abut against the response suction pads 13a before the lower face of the first laminated body S1 (workpiece 1 in the illustrated example) abuts against the still suction pads 12a, and the movable supporting parts 13 compress in the Z-direction, with the response suction pads 13a relatively elastically moving. As abutment (contact) occurs, the response suction pads 13a elastically deform and are pressed against the unsupported portions So. At the same time, the suction action of the second intake and exhaust source 13d makes the response suction pads 13a elastically deform further, and adsorption begins. Thus, the unsupported portions So in contact with the response suction pads 13a at the lower face of the first laminated body S1 are held by adsorption by the response suction pads 13a.

Next, as the robot hands R1 lower, the lower face of the first laminated body S1 abuts against the still suction pads 12a, and the suction action of the first intake and exhaust source 12d makes the still suction pads 12a elastically deform, and adsorption begins. Thus, the unsupported portions So in contact with the still suction pads 12a at the lower face of the first laminated body S1 are held by adsorption by the still suction pads 12a.

Accordingly, in the state after the first laminated body S1 is held as illustrated in FIG. 3, the relative elastic movement of the response suction pads 13a in the Z-direction and the elastic deformation of the response suction pads 13a due to the suction action combine to reduce localized deflection deformation at the unsupported portions So due to its own weight. Accordingly, the entire first laminated body S1 is supported in an immovable manner by the response suction pads 13a and the still suction pads 12a arranged in a dispersed manner.

Figure 4:
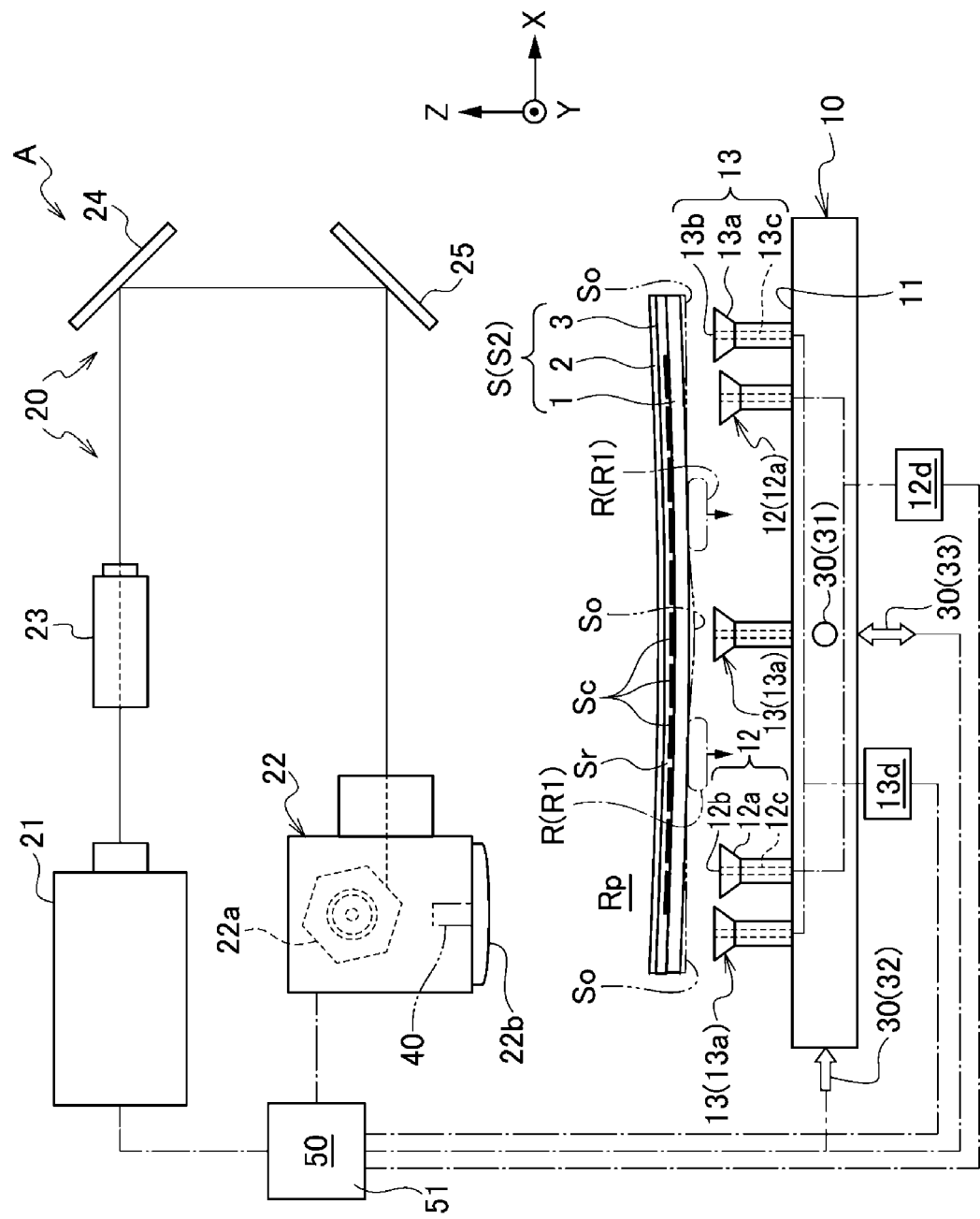
FIG. 4 is an explanatory diagram illustrating the overall configuration of a workpiece-separating device and a workpiece-separating method according to an embodiment (second example) of the present invention and is a front view of a vertical cross section of a state before holding (carrying-in process).
Figure 5:
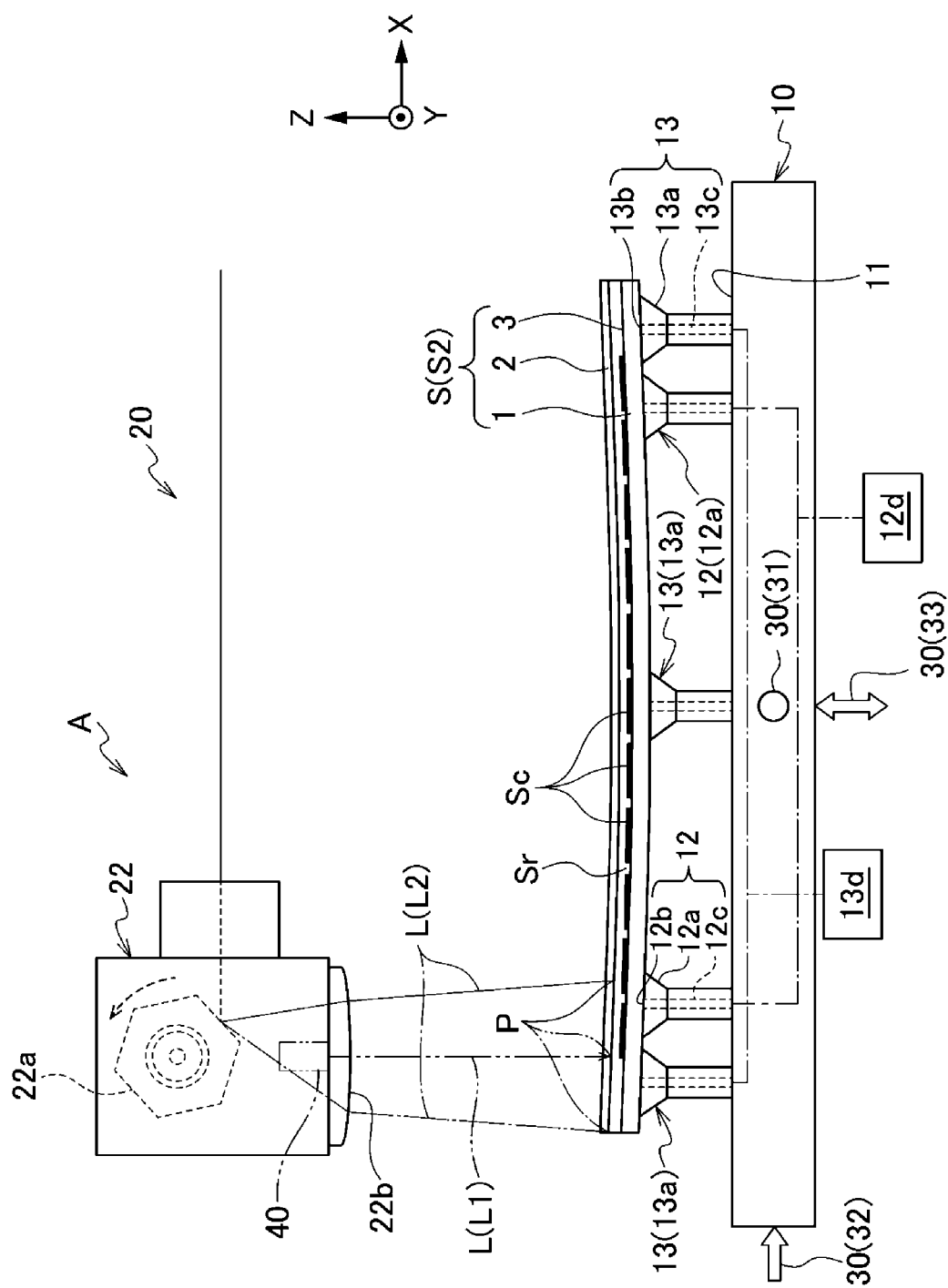
FIG. 5 is a partially enlarged front view of a vertical cross section of a state after holding (holding process) of the same.

The second example illustrated in FIGS. 4 and 5 represents a case of a second laminated body S2 with warpage deformation in that it is recessed on the upper side.

In the state before the second laminated body S2 is held illustrated in FIG. 4, in addition to the second laminated body S2 having warpage deformation, when the lower face of the second laminated body S2 is supported and held from underneath at a plurality of portions by the plurality of robot hands R1, the unsupported portion So that is not a supported portion tends to experience localized deflection deformation due to its own weight.

However, in a similar manner to the first example, also in this case, as the second laminated body S2 is lowered from the space position Rp by the plurality of robot hands R1, the unsupported portions So abut against the response suction pads 13a before the lower face of the second laminated body S2 (workpiece 1 in the illustrated example) abuts against the still suction pads 12a, and the movable supporting parts 13 compress in the Z-direction, with the response suction pads 13a relatively elastically moving. As abutment (contact) occurs, the response suction pads 13a elastically deform and are pressed against the unsupported portions So. At the same time, the suction action of the second intake and exhaust source 13d makes the response suction pads 13a elastically deform further, and adsorption begins. Thus, the unsupported portions So abutted against the response suction pads 13a at the lower face of the second laminated body S2 are held by adsorption by the response suction pads 13a.

Next, as the robot hands R1 is lowered, the lower face of the second laminated body S2 abuts against the still suction pads 12a, and the suction action of the first intake and exhaust source 12d makes the still suction pads 12a elastically deform, and adsorption begins. Thus, the unsupported portions So in contact with the still suction pads 12a at the lower face of the second laminated body S2 are held by adsorption by the still suction pads 12a.

Accordingly, in the state after the second laminated body S2 is held as illustrated in FIG. 5, the relative elastic movement of the response suction pads 13a in the Z-direction and the elastic deformation of the response suction pads 13a due to the suction action combine to reduce localized deflection deformation at the unsupported portions So due to its own weight, which is unrelated to the warpage deformation of the second laminated body S2. Accordingly, the entire second laminated body S2 is supported in an immovable manner by the response suction pads 13a and the still suction pads 12a arranged in a dispersed manner, without needing to forcibly correct the warpage deformation of the second laminated body S2.

Figure 6:
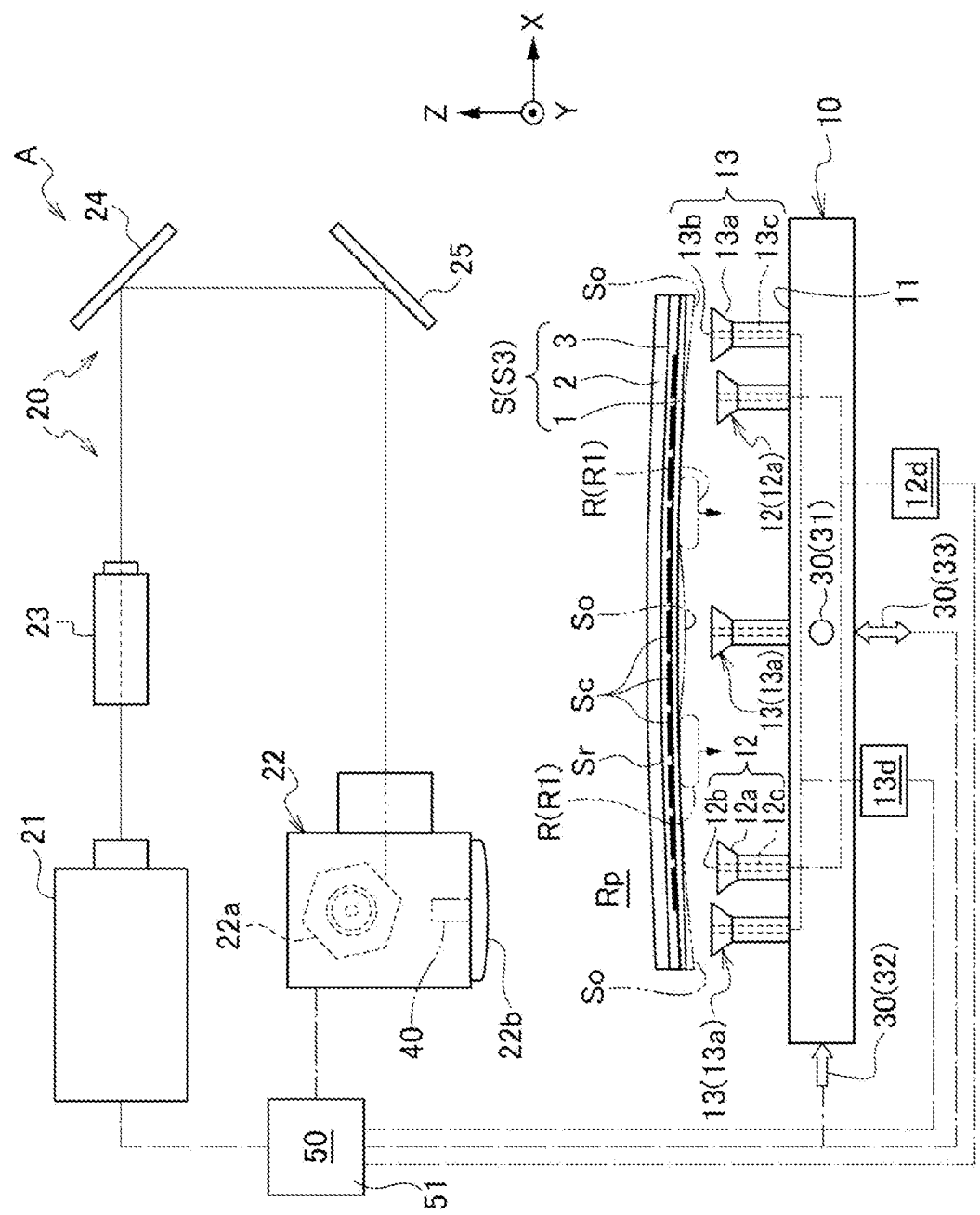
FIG. 6 is an explanatory diagram illustrating the overall configuration of a workpiece-separating device and a workpiece-separating method according to an embodiment (third example) of the present invention and is a front view of a vertical cross section of a state before holding (carrying-in process).
Figure 7:
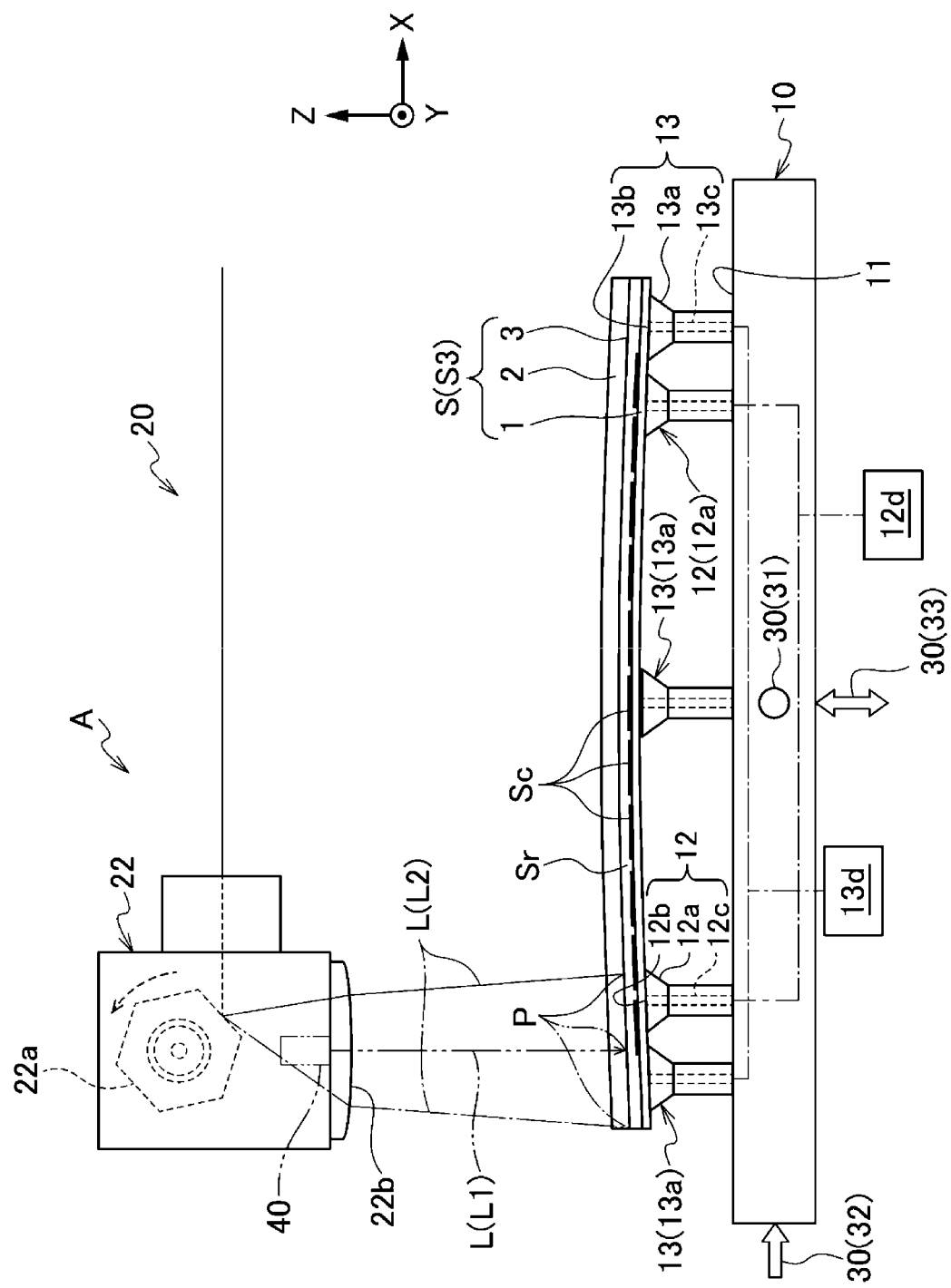
FIG. 7 is a partially enlarged front view of a vertical cross section of a state after holding (holding process) of the same.

The third example illustrated in FIGS. 6 and 7 represents a case of a third laminated body S3 warped to protrude upward.

In the state before the third laminated body S3 is held illustrated in FIG. 6, in addition to the third laminated body S3 having warpage deformation, the unsupported portion So that is a portion not supported by the plurality of robot hands R1 tends to experience localized deflection deformation due to its own weight.

Figure 8:
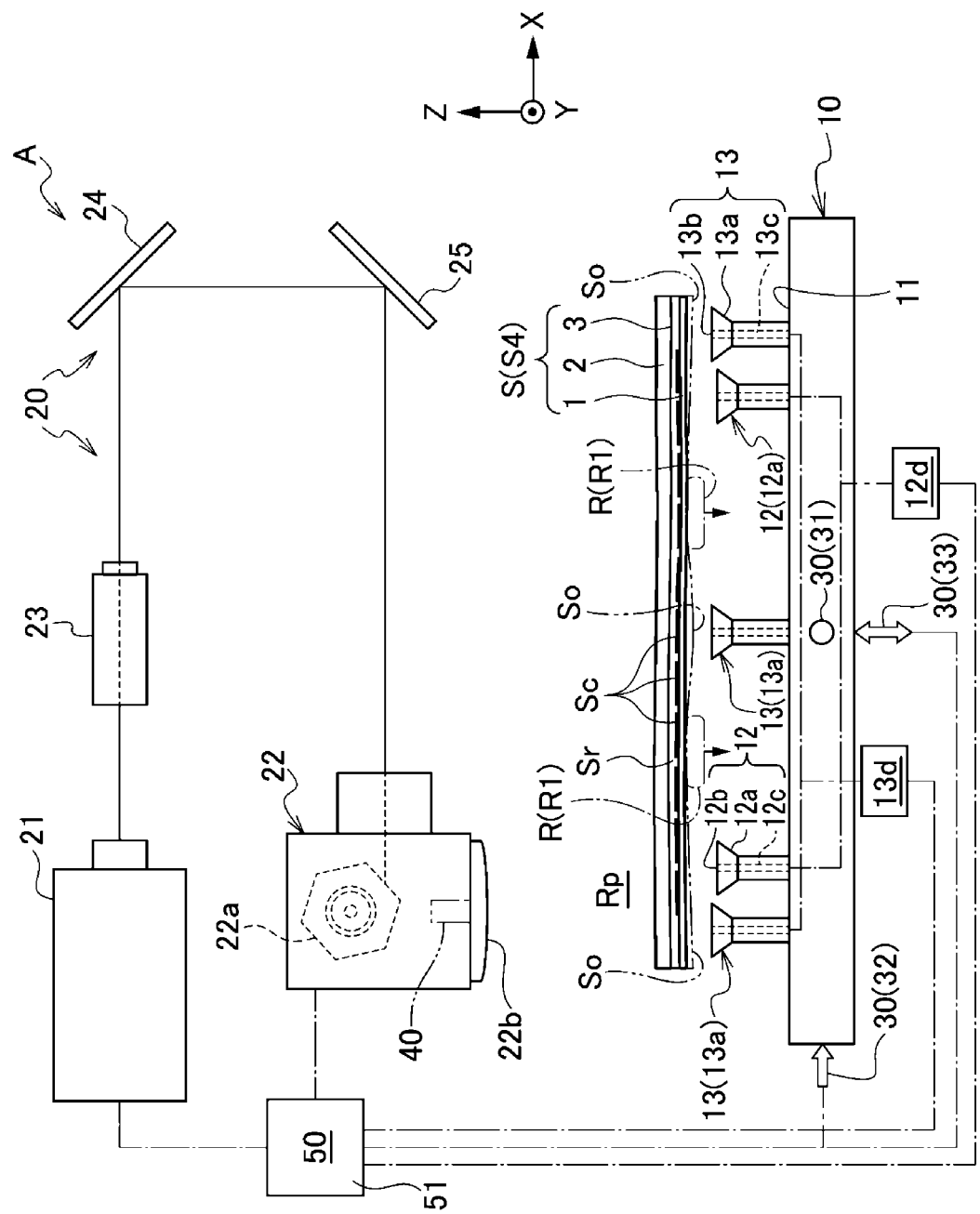
FIG. 8 is an explanatory diagram illustrating the overall configuration of a workpiece-separating device and a workpiece-separating method according to an embodiment (fourth example) of the present invention and is a front view of a vertical cross section of a state before holding (carrying-in process).
Figure 9:
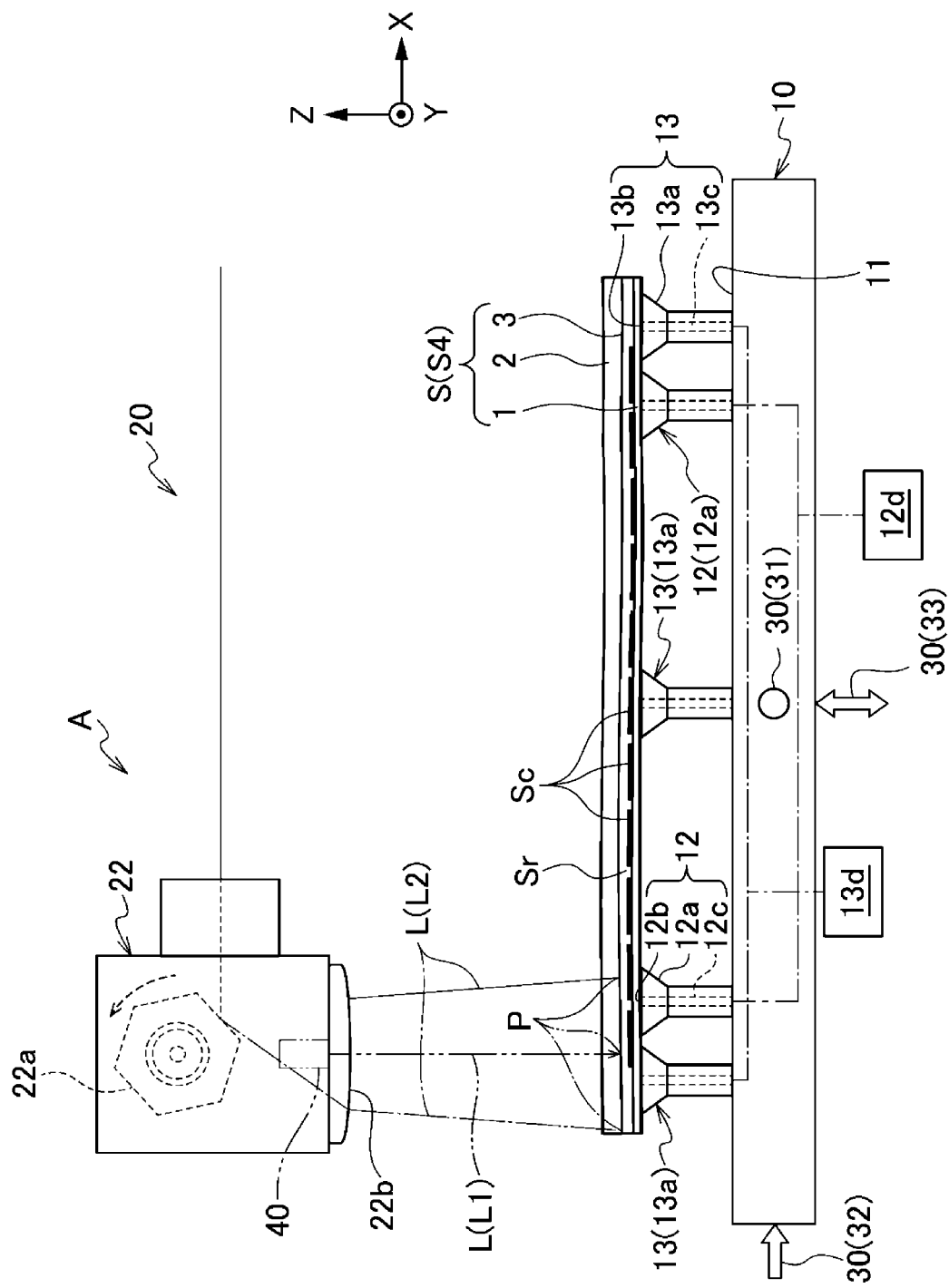
FIG. 9 is a partially enlarged front view of a vertical cross section of a state after holding (holding process) of the same.

The fourth example illustrated in FIGS. 8 and 9 represents a case of a fourth laminated body S4 warped to have a substantially S shape in the up and down directions.

In the state before the fourth laminated body S4 is held illustrated in FIG. 8, in addition to the fourth laminated body S4 having warpage deformation, the unsupported portion So that is a portion not supported by the plurality of robot hands R1 tends to experience localized deflection deformation due to its own weight.

However, in a similar manner to the second example, also in these cases, as the third laminated body S3 or the fourth laminated body S4 is lowered by the plurality of robot hands R1, the unsupported portions So abut against the response suction pads 13a before abutting against the still suction pads 12a, and the movable supporting parts 13 compress in the Z-direction, with the response suction pads 13a relatively elastically moving. As abutment (contact) occurs, the response suction pads 13a elastically deform and are pressed against the unsupported portions So. At the same time, the suction action of the second intake and exhaust source 13d makes the response suction pads 13a elastically deform further, and adsorption begins. Next, as the robot hands R1 is lowered, the lower face of the third laminated body S3 or the fourth laminated body S4 abuts against the still suction pads 12a, and the suction action of the first intake and exhaust source 12d makes the still suction pads 12a elastically deform, and adsorption begins.

Accordingly, in the state after the third laminated body S3 is held as illustrated in FIG. 7 or in the state after the fourth laminated body S4 is held as illustrated in FIG. 9, the relative elastic movement of the response suction pads 13a in the Z-direction and the elastic deformation of the response suction pads 13a due to the suction action combine to reduce localized deflection deformation at the unsupported portions So due to its own weight, which is unrelated to the warpage deformation of the third laminated body S3 and the fourth laminated body S4. Accordingly, the entire laminated body S3 or S4 is supported in an immovable manner by the response suction pads 13a and the still suction pads 12a arranged in a dispersed manner, without needing to forcibly correct the warpage deformation of the laminated body S3 or S4.

With the workpiece-separating device A and the workpiece-separating method according to the embodiment of the present invention such as those described above, because the laminated body S is moved close toward the fixed supporting parts 12 and the movable supporting parts 13, which are arranged in a dispersed manner, the laminated body S first abuts against the response suction pads 13a, causing the response suction pads 13a to elastically move relatively in the projection direction (Z-direction). As abutment occurs, the response suction pads 13a elastically deform and are pressed against the laminated body S. At the same time, the suction action of the response suction pads 13a makes the response suction pads 13a elastically deform further, and adsorption occurs.

Next, the laminated body S abuts against the still suction pad 12a and is adsorbed.

Accordingly, even in a case where the laminated body S has low rigidity due to having a large overall size or a thinned thickness, the relative elastic movement of the response suction pads 13a and the elastic deformation of the response suction pads 13a due to the suction action combine to reduce localized deflection deformation due to its own weight, which is unrelated to the warpage deformation of the laminated body S.

Accordingly, the entire laminated body S is supported in an immovable manner by the response suction pads 13a and the still suction pads 12a arranged in a dispersed manner, without needing to forcibly correct the warpage deformation of the laminated body S.

Thus, the deflection deformation of the laminated body S due to its own weight can be absorbed, and the laminated body S can be held in a stable manner.

As a result, compared to a typical case where a laminated body with warpage deformation is supported at three points by three supporting rods, even with a laminated body S with low rigidity due to having a large size or being thinned, localized damage due to excessive force being applied to a portion of the laminated body S can be prevented without increasing the localized deflection deformation due to the weight of the laminated body S.

Furthermore, the relative elastic movement of the response suction pads 13a and the elastic deformation of the response suction pads 13a due to the suction action combine to reduce localized deflection deformation of the laminated body S due to its own weight. Thus, even considering the warpage deformation of the laminated body S, the light irradiation distance from the light irradiation part 22 to the separating layer 3 does not change largely. Accordingly, the irradiation shape of the light beams L for peeling to the separating layer 3 can be stabilized, reliably preventing parts not being irradiated with the light beams L for peeling and parts being excessively irradiated.

In addition, because the response suction pads 13a elastically move relatively in the projection direction (Z-direction) when the laminated body S abuts against the response suction pad 13a, the response suction pads 13a is elastically deformable to conform to the warped face of the laminated body S warped into various shapes. In this manner, gaps between the two can be prevented, and the laminated body S can be held by adsorption in a stable manner.

In particular, the response suction pads 13a are preferably disposed near the still suction pads 12a.

Because the still suction pads 12a are immovable in the projection direction (Z-direction), deflection deformation due to the weight of the laminated body S tends to occur at portions around the supported portions of the laminated body S adsorbed by the still suction pads 12a.

In this case as well, the response suction pads 13a elastically move and adsorb the unsupported portions So near the supported portions adsorbed by the still suction pads 12a. Thus, localized deflection deformation due to its own weight is reduced.

Accordingly, localized deflection deformation due to its own weight near the still suction pads 12a can be reliably reduced.

As a result, the localized deflection deformation due to the weight of the laminated body S does not increase, and localized damage due to excessive force being applied to a portion of the laminated body S can be reliably prevented.

Furthermore, the controlling part 50 that executes operation control of the light irradiation part 22 is preferably provided, the irradiation of pulse-oscillated spot like laser beams as the light beams L for peeling from the light irradiation part 22 (laser scanner 22a) is preferably aligned irradiation in which portions of the spot like laser beams overlap one another in the plane intersecting the light irradiation direction (Z-direction), and the controlling part 50 performs control to perform aligned irradiation on the entire separating layer 3 by moving the laminated body S held by the holding member 10 and the light irradiation part 22 relative to one another in the direction (XY-directions) that intersects the light irradiation direction (Z-direction) via at least the operation of the light irradiation part 22 and repeating aligned irradiation.

In this case, the laminated body S is held to the stage 11 in a manner that prevents misalignment. Thus, even in a case where there is relative movement in regard to the laminated body S during irradiation of the laser beams L from the light irradiation part 22, the laminated body S is held to the stage 11 by the response suction pads 13a and the still suction pads 12a in a manner that prevents misalignment.

Thus, in the region of aligned irradiation where the portions of the spot like laser beams L overlap, the spot like laser beams L with which the laminated body S is irradiated do not experience misalignment, and the entire separating layer 3 is evenly irradiated with the laser beams L passing through the workpiece 1 or the supporting body 2.

This prevents some parts from not being irradiated and excessive irradiation from being performed during aligned irradiation using the spot like laser beams L.

As a result, localized peeling defects due to the part not being irradiated with the laser beams L are not produced, and the output does not become too strong due to excessive irradiation of the laser beams L. Thus, damage is not caused to the device formed on the circuit substrate of the workpiece 1, and soot due to localized excessive irradiation is not produced.

In this manner, highly-accurate peeling of the workpiece 1 from the laminated body S can be achieved.

Note that in the embodiments described above, the laminated body S includes the workpiece 1 and the supporting body 2 bonded together with the separating layer 3 made of a material with adhesiveness. However, no such limitation is intended, and, in a case where the separating layer 3 is formed from a material that does not have adhesiveness, an adhesive layer (not illustrated) made from an adhesive may be disposed between the separating layer 3 and the workpiece 1 to bond the separating layer 3 and the workpiece 1 together using the adhesive layer.

Furthermore, in the illustrated examples, the laminated body S has a panel shape (square shape). However, no such limitation is intended, and instead of a panel-shaped (square) laminated body S, the laminated body S may be changed to a panel-shaped (rectangular) laminated body S or a wafer-shaped (circular) laminated body S.

In the illustrated examples, of either the workpiece 1 or the supporting body 2 of the laminated body S, the workpiece 1 is held by the fixed supporting parts 12 and the movable supporting parts 13. However, no such limitation is intended, and the laminated body S may be inverted so that the supporting body 2 is held by the fixed supporting parts 12 and the movable supporting parts 13.

In these cases, the same effects and advantages as those of the embodiments described above can be obtained.

REFERENCE SIGNS LIST

A Workpiece-separating device
S Laminated body
1 Workpiece
2 Supporting body
3 Separating layer
10 Holding member
11 Stage
12 Fixed supporting part
12a Still suction pad
13 Movable supporting part
13a Response suction pad
22 Light irradiation part
50 Controlling part
L Light beam (laser beam) for peeling

The invention claimed is:

1. A workpiece-separating device that peels a supporting body from a workpiece including a circuit substrate by denaturing a separating layer via light irradiation of a laminated body, the laminated body including the workpiece and the supporting body laminated together with the separating layer interposed between the workpiece and the supporting body, the workpiece-separating device comprising:
    a holding member configured to hold either the workpiece or the supporting body in a detachable manner; and
    a light irradiation part configured to perform the light irradiation on the separating layer through the other of the supporting body or the workpiece of the laminated body held by the holding member, wherein
    the holding member includes
        a stage facing one of the workpiece or the supporting body of the laminated body,
        a fixed supporting part projecting from the stage toward the laminated body and including, on an end portion, a still suction pad immovable in a projection direction, and
        a movable supporting part projecting from the stage toward the laminated body and including, on an end portion, a response suction pad that is movable in a projection direction and elastically deformable,
    a plurality of the fixed supporting parts and a plurality of the movable supporting parts in combination are disposed in a dispersed manner, and
    the plurality of response suction pads are disposed so as to be able to project toward the laminated body further than the plurality of still suction pads.

2. The workpiece-separating device according to claim 1, wherein
    the response suction pad is disposed near the still suction pad.

3. The workpiece-separating device according to claim 1, further comprising a controlling part configured to execute operation control of the light irradiation part, wherein
    irradiation of pulse-oscillated spot like laser beams as light beams for peeling from the light irradiation part is aligned irradiation in which the spot like laser beams are aligned such that portions of the spot like laser beams overlap one another in a plane intersecting a light irradiation direction; and
    the controlling part performs control to perform the aligned irradiation on the entire separating layer by moving the laminated body held by the holding member and the light irradiation part relative to one another in a direction that intersects the light irradiation direction and repeating the aligned irradiation via at least an operation of the light irradiation part.

4. A workpiece-separating method of peeling a supporting body from a workpiece including a circuit substrate by denaturing a separating layer via light irradiation of a laminated body, the laminated body including the workpiece and the supporting body laminated together with the separating layer interposed between the workpiece and the supporting body, the workpiece-separating method comprising:

holding one of the workpiece or the supporting body with a holding member in a detachable manner; and performing the light irradiation from a light irradiation part on the separating layer through the other of the supporting body or the workpiece of the laminated body held by the holding member, wherein the holding member includes a stage facing one of the workpiece or the supporting body of the laminated body, a fixed supporting part projecting from the stage toward the laminated body and including, on an end portion, a still suction pad immovable in a projection direction, and a movable supporting part projecting from the stage toward the laminated body and including, on an end portion, a response suction pad that is movable in a projection direction and elastically deformable, a plurality of the fixed supporting parts and a plurality of the movable supporting parts in combination are disposed in a dispersed manner, the plurality of response suction pads are disposed so as to be able to project toward the laminated body further than the plurality of still suction pads, and in the holding one of the workpiece or the supporting body, as the laminated body experiences deflection deformation due to its own weight, the response suction pad moves in the projection direction and elastically presses against one of the workpiece or the supporting body.

\* \* \* \* \*